US008860187B2

(12) United States Patent
Kitano et al.

(10) Patent No.: US 8,860,187 B2
(45) Date of Patent: Oct. 14, 2014

(54) SEMICONDUCTOR DEVICE

(71) Applicant: Elpida Memory, Inc., Tokyo (JP)

(72) Inventors: Tomohiro Kitano, Tokyo (JP); Hisayuki Nagamine, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 14/202,555

(22) Filed: Mar. 10, 2014

(65) Prior Publication Data

US 2014/0191416 A1    Jul. 10, 2014

Related U.S. Application Data

(63) Continuation of application No. 13/553,875, filed on Jul. 20, 2012, now Pat. No. 8,704,339.

(30) Foreign Application Priority Data

Aug. 3, 2011    (JP) .................................. 2011-170348

(51) Int. Cl.
*H01L 29/40* (2006.01)
*H01L 23/522* (2006.01)

(52) U.S. Cl.
CPC .................................. *H01L 23/5226* (2013.01)
USPC .................................. 257/621; 257/E23.011

(58) Field of Classification Search
None
See application file for complete search history.

(56) References Cited

U.S. PATENT DOCUMENTS

| 6,393,575 | B1 | 5/2002 | Kang et al. |
| 2007/0164833 | A1 | 7/2007 | Kottschlag |
| 2007/0222050 | A1* | 9/2007 | Lee et al. ...................... 257/678 |
| 2010/0195364 | A1 | 8/2010 | Riho |
| 2011/0026293 | A1 | 2/2011 | Riho |

FOREIGN PATENT DOCUMENTS

| JP | 2-44597 | 2/1990 |
| JP | 11-274414 | 10/1999 |
| JP | 2010-182368 | 8/2010 |
| JP | 2011-29535 | 2/2011 |

* cited by examiner

*Primary Examiner* — Michael Lebentritt
*Assistant Examiner* — Kevin Quinto
(74) *Attorney, Agent, or Firm* — Young & Thompson

(57) ABSTRACT

A semiconductor device comprises a first external terminal having a first size, a plurality of second external terminals each having a second size smaller than the first size, an external terminal area in which the first external terminal and the second external terminals are arranged, and a plurality of wires connecting between the second external terminals and a plurality of circuits formed adjacent to the external terminal area and corresponding to the second external terminals. The second external terminals and the wires constitute a plurality of interfaces. Each of the interfaces includes at least one adjustment portion that adjusts a time constant of the wire so that the wires have the same time constant. At least part of the adjustment portions is located in a margin area produced in the external terminal area by a difference between the first size and the second size.

22 Claims, 15 Drawing Sheets

FIG. 8

SEMICONDUCTOR DEVICE

CROSS REFERENCE TO RELATED APPLICATIONS

This application is a continuation of Ser. No. 13/553,875 filed on Jul. 20, 2012, which claims foreign priority to Japanese Application No. 2011-170348 filed on Aug. 3, 2011. The entire contents of each of the above applications are incorporated by reference.

BACKGROUND OF THE INVENTION

1. Field of the Invention

The present invention relates to a semiconductor device, and more particularly to a semiconductor device comprising a plurality of external connection terminals.

2. Description of Related Art

In a related semiconductor device, transmission lines connecting between a plurality of input/output pads and a plurality of input buffers corresponding to the input/output pads are formed so as to have the same length in order to make delay times of those transmission lines equal to each other (Patent Literature 1).

Furthermore, in another related integrated memory, a delay circuit for adjusting an internal signal delay time difference is inserted between an address input terminal and an address latch circuit (Patent Literature 2).

Moreover, there has been known a related semiconductor device in which a plurality of chips are stacked so that signal transmission between the stacked chips is performed via electrodes extending through the chips (Patent Literature 3). Some of those semiconductor devices are configured such that penetrating wires have the same length (Patent Literature 4).

Patent Literature 1: JP-A 11-274414 (FIG. 2 in particular)
Patent Literature 2: JP-A 02-044597 (FIG. 1 in particular)
Patent Literature 3: JP-A 2010-182368 (FIG. 1 in particular)
Patent Literature 4: JP-A 2011-029535 (FIG. 1 in particular)

SUMMARY

The present inventor has recognized that, in order to make signal delays of a plurality of signal paths equal to each other, it is necessary to make lengths of those signal paths equal to each other or to insert a delay element into each of the signal paths. In other words, apart from a signal path used as a reference for adjustment, all of the other signal paths should have a delay adjustment portion provided thereon.

With such a method, however, the number of delay adjustment portions increases as the number of signal paths increases. Therefore, it is difficult to ensure spaces for placing those delay adjustment portions. Particularly, when the number of external terminals is increased, not only spaces for placing those external terminals, but also spaces for placing delay adjustment portions that adjust delays of lines connected to those external terminals are required in a semiconductor device in which miniaturization and high integration are demanded. As a result, chips become larger in size.

In one embodiment, there is provided a semiconductor device that comprises a first chip including a first external terminal having a first size, a plurality of second external terminals each having a second size smaller than the first size, an external terminal area in which the first external terminal and the plurality of second external terminals are arranged based upon the first size, a plurality of circuits formed adjacent to the external terminal area, the plurality of circuits corresponding to the plurality of second external terminals, and a plurality of wires connecting between the plurality of second external terminals and the plurality of circuits. The plurality of second external terminals and the plurality of wires connected to the plurality of second external terminals constitute a plurality of interfaces. Each of the plurality of interfaces includes at least one adjustment portion that adjusts a time constant of the wire so that the plurality of wires have the same time constant. At least part of the adjustment portions is located in a margin area produced in the external terminal area by a difference between the first size and the second size.

In another embodiment, there is provided a semiconductor device that comprises a semiconductor substrate, first and second through silicon via (TSV) formed through the semiconductor substrate, and a first external terminal formed over the first TSV and connected to the first TSV. The first external terminal has a first size, from a top of view, which receives a power source. The semiconductor device further comprises a second external terminal formed over the second TSV and connected to the second TSV. The second external terminal has a second size, from the top of view, smaller than the first size by a predetermined area for receiving a signal. The semiconductor device still further comprises an input/output circuit and a wire connected between the second external terminal and the input/output circuit. The wire has a bent portion, from the top of view, in the predetermined area.

In still another embodiment, there is provided a system that comprises the above-mentioned semiconductor device, a bus connected to the semiconductor device, and a second semiconductor device connected to the bus.

According to the present invention, the adjustment portions that adjusts time constants of the plurality of interfaces are formed within the external terminal area. At least part of the adjustment portions is located in the margin area produced by the difference between the first size and the second size. Therefore, time constants of the interfaces can be made substantially equal to each other without an increased size of the device.

BRIEF DESCRIPTION OF THE DRAWINGS

The above features and advantages of the present invention will be more apparent from the following description of certain preferred embodiments taken in conjunction with the accompanying drawings, in which:

FIG. 8 is a diagram showing details of the arrangement example of the through electrodes shown in FIG. 7;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A typical example of the technical concept of the present invention for solving problems in the related art will be shown below. The present invention is not limited to the illustrated technical concept and should be defined by claims of the present application.

Figure 1:
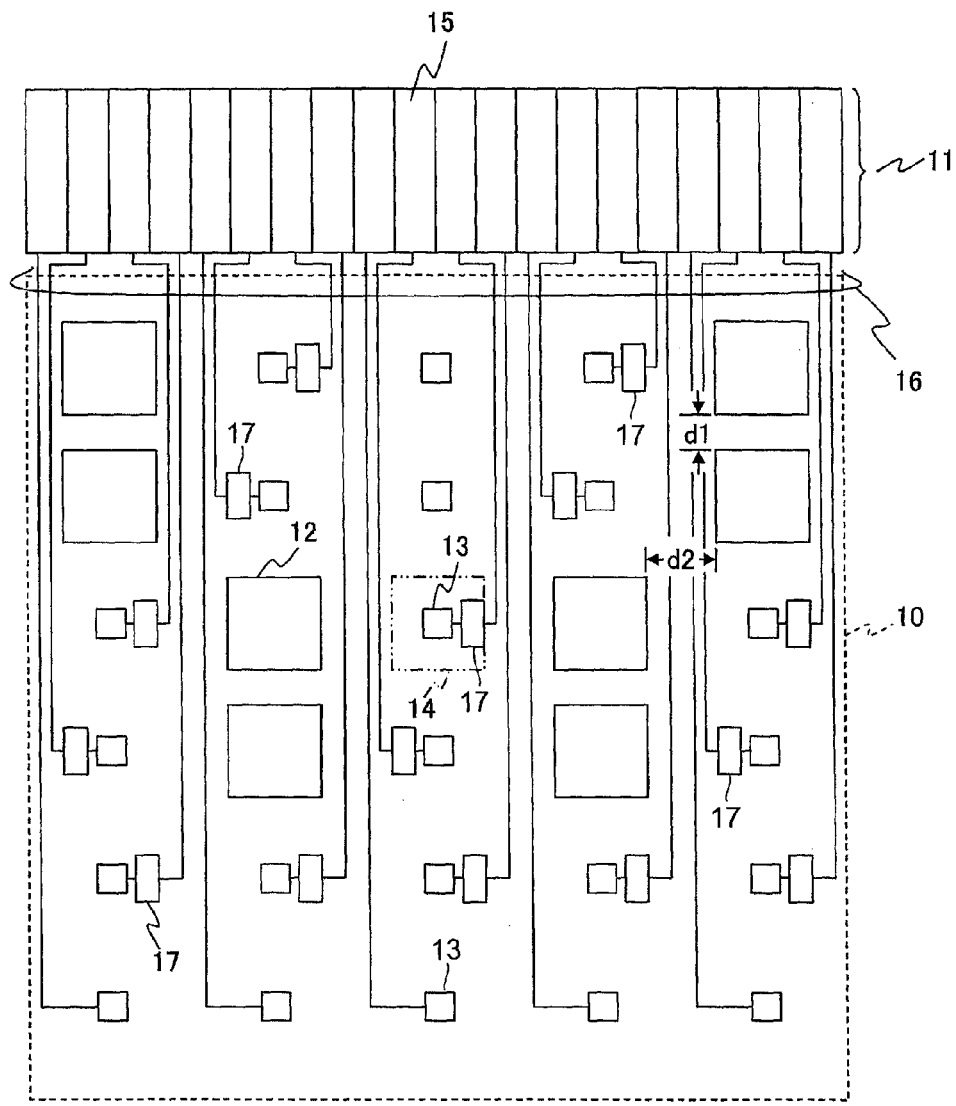
FIG. 1 is a plan view showing an example of the technical concept of the present invention.

FIG. 1 is a plan view showing an example of the technical concept of the present invention. Specifically, FIG. 1 illustrates part of a semiconductor device, i.e., part of an input/output control area in a semiconductor memory device.

The illustrated input/output control area includes an external terminal area 10 and an input/output circuit area (circuit formation area) 11 located adjacent to the external terminal area 10.

A plurality of external terminals are arranged in the external terminal area 10. The external terminals include first external terminals 12 having a first size that is relatively large and second external terminals 13 having a second size smaller than the first size.

The first and second external terminals 12 and 13 may be chip pads exposed on a surface of the semiconductor device. Alternatively, the first and second external terminals 12 and 13 may be some of connection pads included in through electrodes. It is preferable to form the first and second external terminals 12 and 13 by using the same wiring layer. Nevertheless, the first and second external terminals 12 and 13 may be formed by using different wiring layers.

The first size and the second size refer to the size (occupancy area) in a direction (a direction parallel to the sheet) perpendicular to the thickness direction of the semiconductor chip (a direction from the front side to the back side of the sheet). In the case where the first and second external terminals 12 and 13 are formed by using through electrodes, the first size and the second size refer to the size of the largest pad of the connection pads included in those through electrodes. Usually, the largest pad is a connection pad located on the uppermost layer among connection pads formed in multiple wiring layers.

Locations at which the first and second external terminals 12 and 13 are formed in the external terminal area 10, i.e., external terminal formation locations, are defined based upon the first size. Specifically, the external terminal formation locations are defined such that each of the terminals is out of contact with other surrounding terminals and that a space is left for arranging necessary wires around the each of the terminals, on the assumption that the first external terminals 12 are arranged with rows and columns (like an array matrix). In FIG. 1, 30, external terminal formation locations are defined with six rows and five columns. The external terminal formation locations are spaced with a predetermined interval d1 in a first direction (the vertical direction in FIG. 1) and spaced with a predetermined interval d2 (>d1) in a second direction (the lateral direction in FIG. 1). As a result of provision of the intervals d1 and d2, the external terminal formation locations are defined based upon the size larger than the first size.

When the second external terminals 13, which have the second size smaller than the first size, are formed on the external terminal formation locations defined based upon the first size, then margin areas 14 are provided around the second external terminals 13 by the difference between the first size and the second size.

For example, the first external terminals 12 are power supply terminals that supplies electric power to a plurality of input/output circuits 15 formed in the input/output circuit area 11. For example, the second external terminals 13 are data input/output terminals that receive data from and transmit data to the input/output circuits 15. The power supply terminals should have a size larger than the size of the data input/output terminals in consideration of electromigration or the like. Each of the data input/output terminals is connected to a corresponding one of the input/output circuits 15 by a wire 16. The interval d2 is set to be larger than the interval d1 in order to arrange those wires 16.

As is apparent from FIG. 1, distances between the second external terminals 13 and the corresponding input/output circuits 15 vary depending upon the positions at which the second external terminals 13 are formed. Therefore, wires connecting between the second external terminals 13 and the corresponding input/output circuits 15 should have the same time constant in order to equalize data transmission times between the second external terminals 13 and the corresponding input/output circuits 15. Time constants of the wires are affected by the parasitic capacitance of the second external terminals 13 being connected and the like. Accordingly, the second external terminals 13 should also be taken into account as well as the wires 16 when time constants of the wires are to be considered. A combination of each of the second external terminals 13 and the wire 16 connected to the second external terminal 13 is referred to as an interface.

In order to make time constants of a plurality of interfaces substantially equal to each other, the second external terminals 13 located in the farthest row from the input/output circuit area 11 (the lowermost row in FIG. 1) are used as a reference for adjustment. Alternatively, the second external terminals 13 located in the nearest row from the input/output circuit area 11 (the uppermost row in FIG. 1) are used as a reference for adjustment. FIG. 1 illustrates the former case.

Wires 16 connecting between the second external terminals 13 used as a reference for adjustment and the corresponding input/output circuits 15 are formed so that the length of those wires 16 are as short as possible while the wires 16 have a predetermined width.

For each of the second external terminals 13 located in the rows other than the row used as a reference for adjustment, an adjustment portion 17 that adjusts a time constant is provided according to the location of the row. Each of the adjustment portions 17 is formed in the external terminal area 10 so that at least part of the adjustment portion 17 is located within the margin area 14. The external terminal area 10 is defined so as to have the minimum space required to arrange a predetermined number of terminals based upon the first size as described above.

At least part of the adjustment portions 17 is formed with use of a wiring layer used for formation of the wires 16. For example, when the lengths of wires 16 having the same width are made equal to each other in a case where such wires 16 are used for all of the interfaces, the adjustment portions 17 are the wires 16 themselves. In other words, the adjustment portions 17 are formed by part of the wires 16. Furthermore, the adjustment portions 17 are not necessarily provided in the middle of the wires 16 as shown in FIG. 1. The adjustment portions 17 may be formed as a widened part (part of the wires) for changing the width of the wires 16. In this case, an adjustment capacitor (capacitance element) connected to the second external terminal 13 may be formed as other part of the adjustment portion 17. At least part of the adjustment capacitor is also formed by using a wiring layer used for formation of the second external terminals 13.

Preferred embodiments of the present invention will be described in detail with reference to FIGS. 2 to 20.

Figure 2:
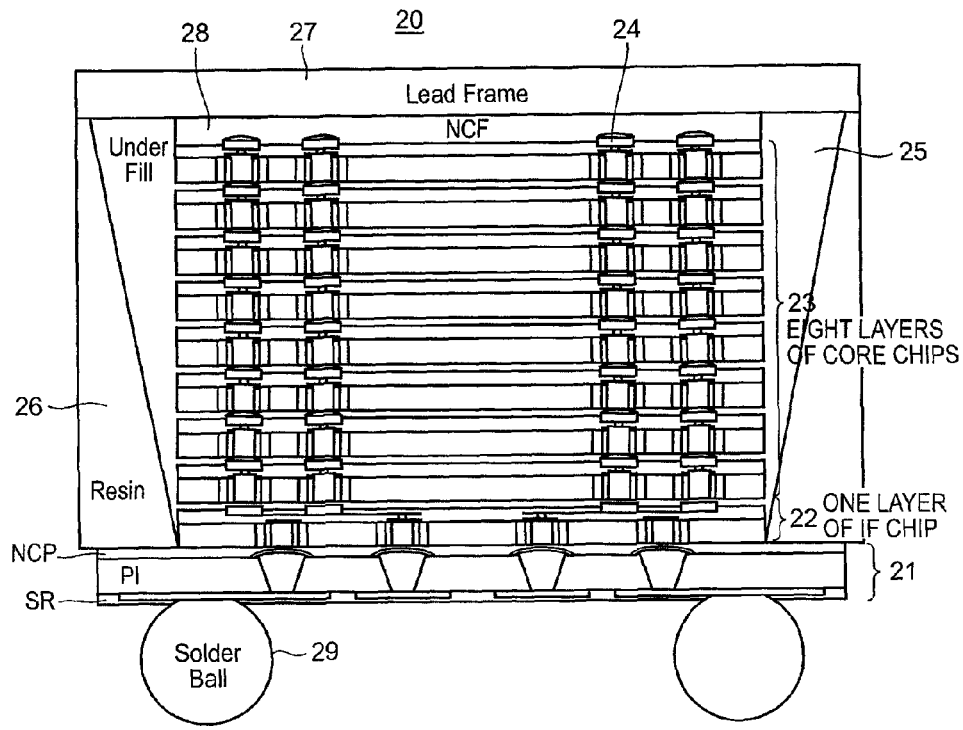
FIG. 2 is a vertical cross-sectional view showing an outlined structure of an example of a semiconductor device to which the present invention is applied.

FIG. 2 is a cross-sectional view showing an example of a semiconductor device 20 to which the present invention is applicable. The illustrated semiconductor device 20 includes a substrate 21, a controller chip 22 mounted on the substrate 21, and a plurality of core chips (first chips) 23 stacked on the controller chip 22. In FIG. 2, eight core chips 23 are provided. Each of the core chips 23 has a plurality of through electrodes 24 formed therein. Each of the core chips 23 is electrically connected to another core chip 23 or the controller chip 22, which is located on an upper side and/or a lower side of the core chip 23, via the through electrodes 24. The controller chip (second chip) 22 may have a plurality of CPUs operable to access the core chips 23. Furthermore, the controller chip 22 may have other functions that are not associated with the core chips 23.

The core chips 23 may have the same function or may have different functions. In this example, the core chips 23 have the same function, and the core chips 23 are stacked on the controller chip 22. In the case where the core chips 23 have different functions, however, the controller chip 22 is not necessarily required. For example, the core chips 23 may be dynamic random access memory (DRAM) chips.

Furthermore, the semiconductor device 20 has an underfill 25 for filling gaps between the stacked core chips 23. A periphery of the underfill 25 is sealed by a resin (sealing resin) 26. A lead frame 27 is attached to an upper portion of the semiconductor device 20 by an adhesive film 28. Solder balls 29 are attached to a lower surface of the substrate 21.

Figure 3:
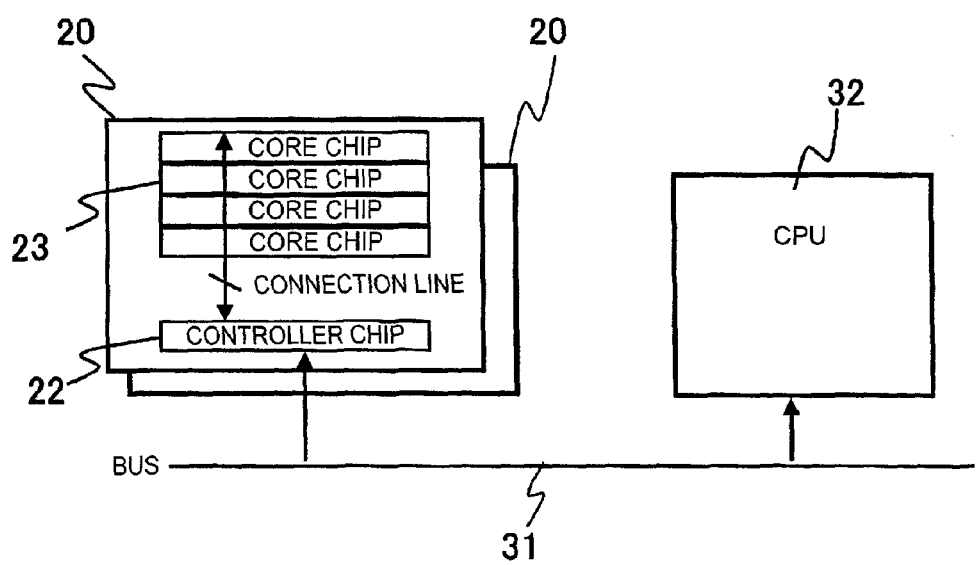
FIG. 3 is a block diagram showing an example of a system using the semiconductor device of FIG. 2.

The semiconductor device 20 shown in FIG. 2 is connected to a CPU (second semiconductor device) 32 via a bus 31, for example, as shown in FIG. 3. Thus, an information processing system is constructed. The CPU 32 controls the core chips 23 included in the semiconductor device 20 via the bus 31. The system may include a plurality of semiconductor devices 20 or a plurality of CPUs 32.

Figure 4:
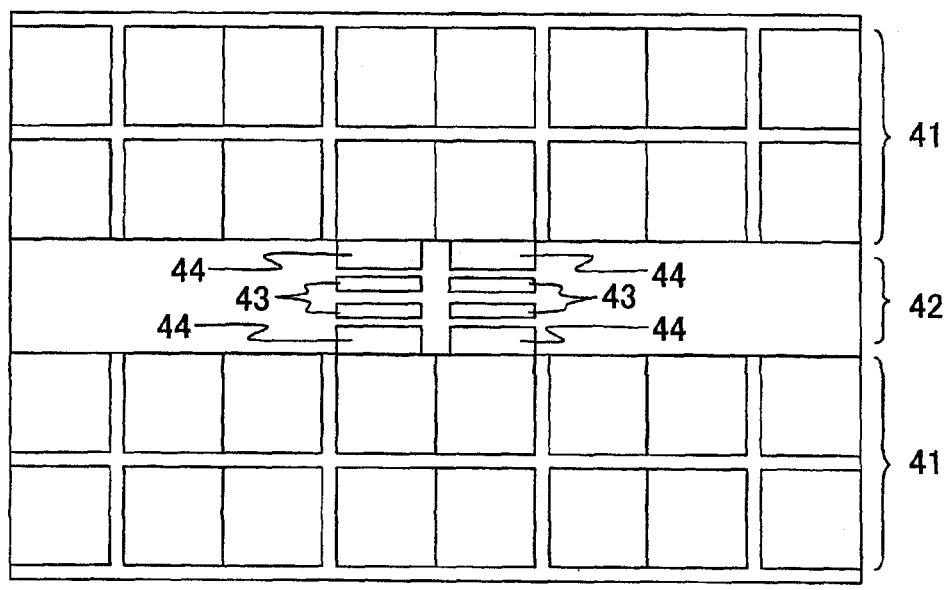
FIG. 4 is a diagram showing an example of a two-dimensional layout of a DRAM chip.

In the case where the core chips 23 are DRAM chips, the two-dimensional layout of a core chip is as shown in FIG. 4, for example. Specifically, memory array areas 41 are disposed on an upper side and a lower side of FIG. 4. An input/output control area 42 is disposed between those memory array areas 41, i.e., at a central portion of the core chip. The input/output control area 42 includes through electrode arrangement portions 43 in which a plurality of through electrodes are arranged and circuit portions 44 connected to the through electrode arrangement portions 43.

Figure 5:
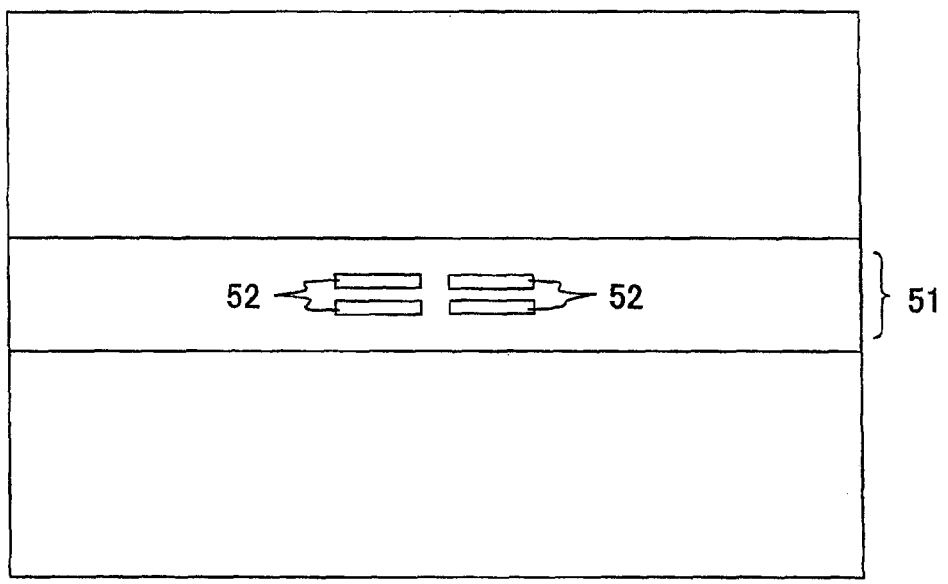
FIG. 5 is a diagram showing an example of a two-dimensional layout of a controller chip.

As shown in FIG. 5, the controller chip 22 (FIG. 2) has an input/output control area 51 located at a position corresponding to the input/output control area 42 (FIG. 4) of the core chip 23. The input/output control area 51 includes through electrode arrangement portions 52 located at positions corresponding to the through electrode arrangement portions 43 (FIG. 4). All or part of the rest of the controller chip 22 is used as a control circuit area. For example, the controller chip 22 operates as an algorithm pattern generator (ALPG).

Next, the through electrodes formed in the through electrode arrangement portions 43 will be described. The following description can also be applied to the through electrode arrangement portions 52.

Figure 6:
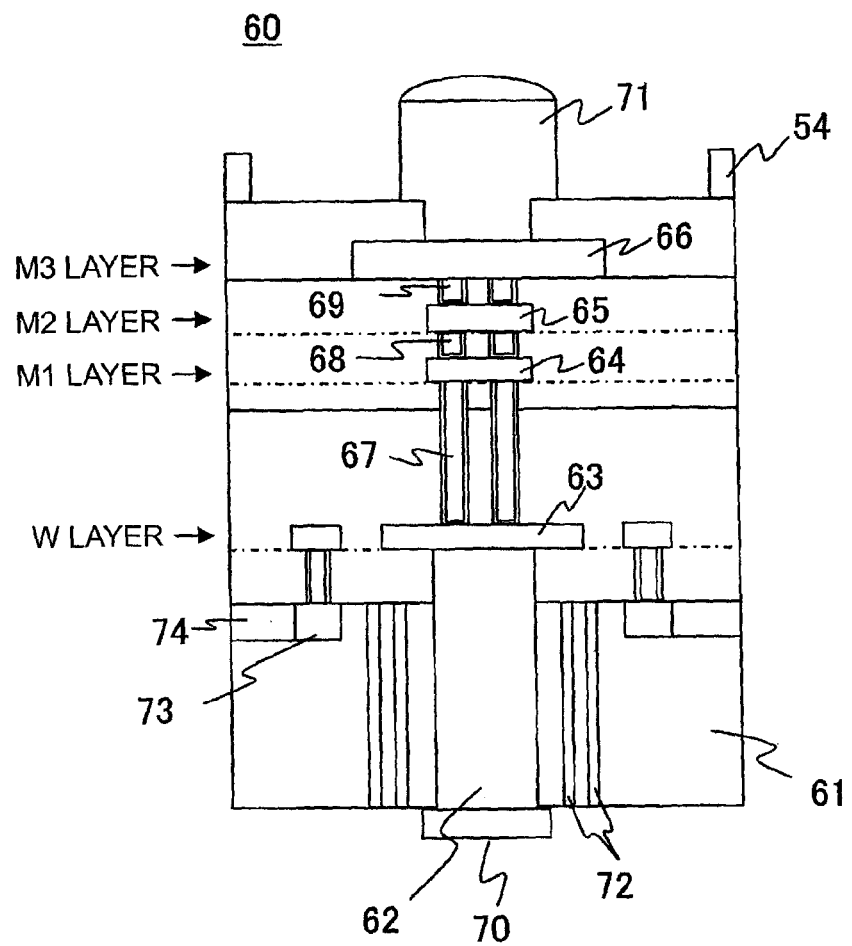
FIG. 6 is a vertical cross-sectional view showing an outlined structure of an example of a through electrode.

For example, each of the through electrodes has a structure as shown in FIG. 6. Specifically, the through electrode 60 includes a rear through silicon via (TSV) 62 extending through a substrate (Si substrate) 61 of each core chip, connection pads 63, 64, 65, and 66 stacked on the rear TSV 62, and vias 67, 68, and 69 electrically connecting between the connection pads.

Furthermore, the through electrode 60 has a rear bump 70 formed on a rear face of the core chip (at a lower side of FIG. 6) and a front bump 71 formed on a front face of the core chip (at an upper side of FIG. 6). The rear bump 70 is connected to the rear TSV 62. The front bump 71 is connected to the connection pad 66.

TSV trenches 72 are formed around the rear TSV 62. The rear TSV 62 is electrically isolated from circuits 73 formed around the rear TSV 62 (on one side of the substrate 61. The circuits 73 are electrically isolated from peripheral components by shallow trench isolation (STI) 74.

The connection pads 63-66 are formed by using multiple wiring layers stacked with interlayer dielectrics interposed therebetween. For example, the connection pad 63 is formed in a W (tungsten) layer. For example, the connection pads 64-66 are formed in first to third Al (aluminum) layers, respectively. The number of wiring layers is properly selected depending upon the configuration of the core chip. In FIG. 6, the vias 67-69 connecting between two connection pads include two vias in each of the layers. Nevertheless, the vias 67-69 may include one or more vias in each of the layers.

With the above configuration, the through electrode 60 transmits a signal inputted from the front bump 71 to the rear bump 70 and transmits a signal inputted from the rear bump 70 to the front bump 71. If signal lines (not shown) are connected to the connection pads 63-66, the through electrode 60 transmits a signal from those signal lines to the front bump 71 and the rear bump 70 and transmits a signal from the front bump 71 or the rear bump 70 to those signal lines.

A connection pad having the largest size in the connection pads 63-66 of the through electrode 60 (usually the uppermost connection pad 66) determines the size of the through electrode 60 (the occupancy area as seen from above the through electrode 60). The connection pad that determines the size of the through electrode 60 corresponds to the external terminals 12 and the external terminals 13 in FIG. 1. In a case where the first external terminals 12 and the second external terminals 13 of FIG. 1 are formed by through electrodes, the size of a connection pad having the largest size in the connection pads 63-66 differs between the first external terminals 12 and the second external terminals 13. Except for this difference, the first external terminals 12 and the second external terminals 13 have the same structure. Wires connected to the first external terminals 12 and the second external terminals 13 may be connected to any of the connection pads 63-66.

Figure 7:
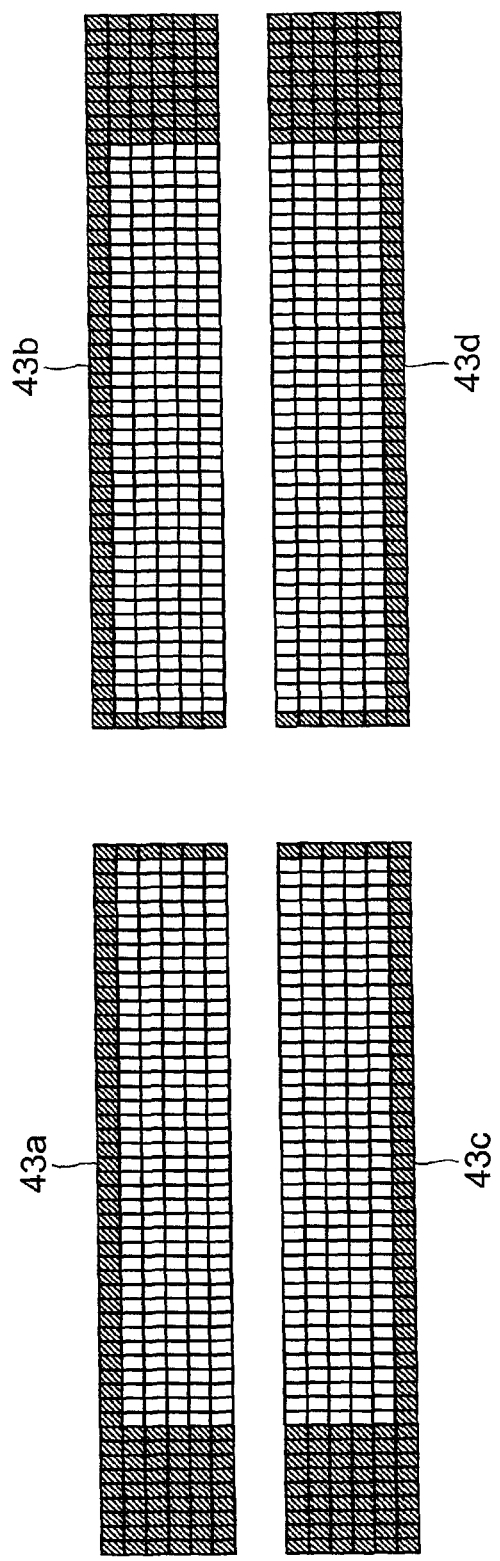
FIG. 7 is a diagram showing an arrangement example of through electrodes.

The arrangement of the through electrodes in the through electrode arrangement portions 43 conforms to the standard of the Joint Electron Device Engineering Council (JEDEC). The specification being currently standardized defines 128, data (DQ) terminals as one channel and also defines arrangement of four channels of DQ terminals (128×4=512) and address/command terminals corresponding to those DQ terminals. FIG. 7 shows an outlined arrangement of through electrodes in accordance with this specification.

In FIG. 7, four through electrode arrangement portions 43a, 43b, 43c, and 43d, correspond to channels 0, 1, 2, and 3, respectively. Each of small squares in FIG. 7 corresponds to a through electrode. Address/command terminals are roughly arranged in hatched areas, and DQ terminals are roughly arranged in non-hatched areas. The terminal arrangement of channel 0 is used as a basis and reversed to produce the terminal arrangements of channel 1 and channel 2. The terminal arrangement of channel 1 or channel 2 is reversed to produce the arrangement of channel 3. Such a terminal arrangement is called a mirror arrangement.

Figure 8:
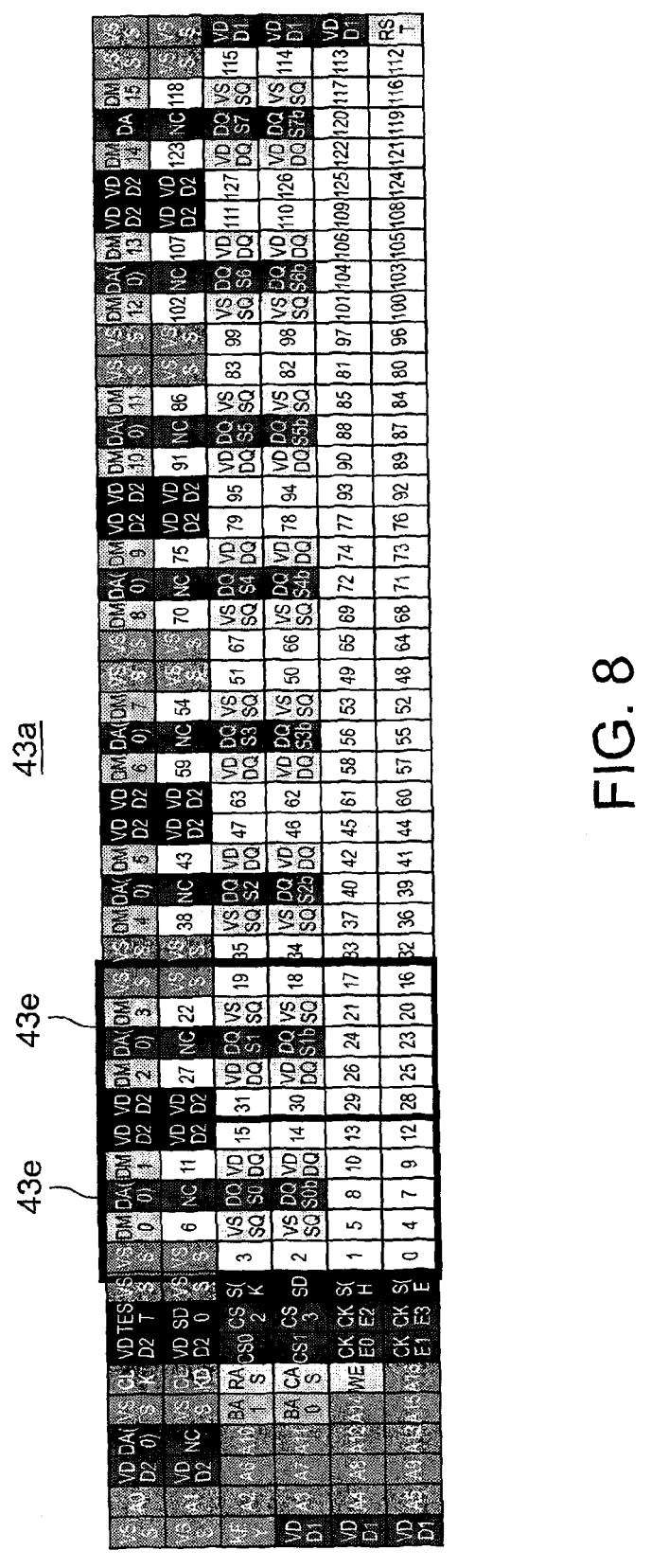

FIG. 8 shows an enlarged terminal arrangement of channel 0. In FIG. 8, each of small squares has a symbol or a number corresponding to the role of the square. The detailed explanation of the symbols and numbers is omitted herein. The small squares with the number 0-127 are DQ terminals. As can be seen from FIG. 8, terminals with 6, rows and 5, columns are combined into one group, which is hereinafter referred to as a terminal arrangement unit 43e, in the terminal arrangement including DQ terminals. Such terminal arrangement units 43e, are repeatedly arranged in a mirrored manner.

Each of the terminal arrangement units 43e, includes 16, DQ terminals, two data strobe (DQS) terminals, power supply (VDD) terminals, ground (VSS) terminals, data mask (DM) terminals, a direct access (DA) terminal, and a non-connect (NC) terminal.

A first embodiment of the present invention will be described in detail with reference to FIG. 9. There will be described a DRAM using the aforementioned through electrodes. Nevertheless, the present invention is applicable to any semiconductor device having a number of external terminals and wires connected to those external terminals in which those wires need to have the same time constant. The external terminals are not limited to through electrodes and, for example, may be connection pads to which wires are connected by wire bonding. Although the following description illustrates one terminal arrangement unit 43e, it can be applied to other terminal arrangement units.

Figure 9:
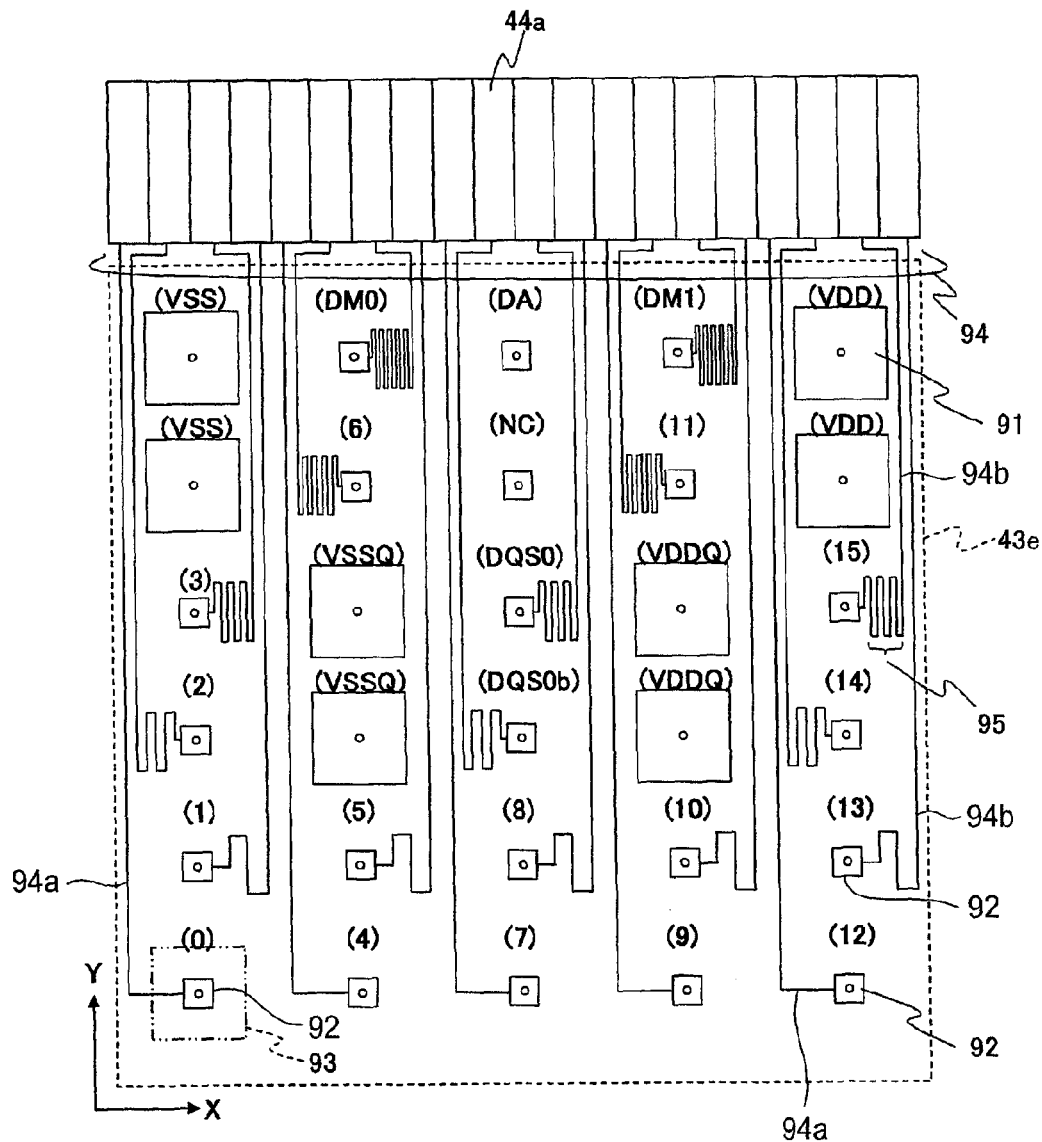
FIG. 9 is a diagram explanatory of a semiconductor device according to a first embodiment of the present invention.

FIG. 9 shows one terminal arrangement unit 43e, and a plurality of input/output circuits 44a corresponding to the terminal arrangement unit 43e. In FIG. 9, the Y-direction (first direction) and the X-direction (second direction) perpendicular to each other are indicated to facilitate the understanding of the following description. The input/output circuits 44a, are arranged in the X-direction. The terminal arrangement unit 43e, is disposed adjacent to the input/output circuits 44a, in the Y-direction. The size of an area in which the terminal arrangement unit 43e, is formed is defined based upon a larger one (first size) of two sizes of terminals being formed as with the input/output circuit area 11 of FIG. 1.

In FIG. 9, 30, terminals (through electrodes) are arranged as the terminal arrangement unit 43e, with 6, rows and 5, columns. A circle illustrated at the center of each of the terminals represents the position and size of a TSV hole (diameter of a rear TSV). As can be seen from FIG. 9, the TSV holes are arranged along the X-direction and the Y-direction. Furthermore, all of the TSV holes have the same size. The arrangement intervals of the TSV holes, which correspond to d1 and d2 of FIG. 1, are designed such that the intervals in the X-direction are larger than the intervals in the Y-direction. This is because wires are provided within those intervals.

In FIG. 9, a symbol or number in the parenthesis provided near each of the terminals represents a function assigned to the terminal. The numbers (0)-(15) are assigned to the DQ terminals. Those DQ terminals are used to receive data from and transmit data to the input/output circuits 44a.

Among the terminals included in the terminal arrangement unit 43e, VDD terminals, VDDQ terminals, VSS terminals, and VSSQ terminals (hereinafter referred to as power supply terminals 91) have a first size that is relatively large. Specifically, the power supply terminals 91 correspond to the first external terminals 12 of FIG. 1. Those power supply terminals 91 are used to supply electric power to the input/output circuits 44a.

Meanwhile, DQ terminals, DQS terminals, and DM terminals (hereinafter referred to simply as DQ terminals 92) have a second size that is relatively small. Specifically, the DQ terminals 92 correspond to the second external terminals 13 of FIG. 1.

Here, the size of the terminals refers to an occupancy area as seen from above the through electrode of FIG. 6. A difference between the first size of the power supply terminals 91 and the second size of the DQ terminals 92 produces margin areas 93 around the DQ terminals 92.

In the first embodiment, delay times of wires 94 connecting between the respective DQ terminals 92 and the corresponding input/output circuits 44a, are all made equal to each other. For this purpose, in the first embodiment, all of the wires 94 connected to the DQ terminals 92 are designed so as to have the same width and the same length. Thus, time constants of interfaces formed by the respective terminals 92 and the wires 94 are made equal to each other.

Specifically, wires 94a, connecting between the DQ terminals 92 ((0), (4), (7), (9), and (12)) located farthest from the input/output circuits 44a, and the input/output circuits 44a, corresponding to those DQ terminals 92 are formed so as to have a length as short as possible. The length of other wires 94b, connecting between the other DQ terminals 92 and the input/output circuits 44a corresponding to those DQ terminals 92 is made equal to the length of the wires 94a. The wires 94 should not necessarily be formed by using the same wiring layer. If different wiring layers are used to form the wires 94, the thickness of the wiring layers should be taken into account. In other words, when all of the wires 94 are formed by using the same wiring layer, the wires 94 can be regarded as having the same thickness, so that it is not necessary to consider the thickness of the wiring layers.

Since all of the wires 94 connected to the DQ terminals 92 are designed so as to have the same length, the wires 94 connected to the DQ terminals 92 located near the input/output circuits 44a include surplus portions (extension portion). If the DQ terminal 92 is located closer to the input/output circuits 44a, a surplus portion of the wire 94 being connected becomes longer. The surplus portions of the wires 94 are bent in a meandering manner and disposed within the margin areas 93. Those surplus portions of the wires 94 serve as adjustment portions 95 for adjusting a time constant of an interface of the DQ terminal 92 and the wire 94.

Thus, according to the first embodiment, thicknesses, widths, and lengths of all of the wires 94 connecting between the DQ terminals 92 and the corresponding input/output circuits 44a, are made equal to each other. Therefore, resistances and capacities (capacitances) of the wires 94 can be made equal to each other. Furthermore, since the adjustment portions 95 are formed by using a wiring layer used for formation of the DQ terminals 92, the influence from varied time constants due to variations of ambient environment such as temperature change can be equalized for all of the DQ terminals 92.

When the wiring pattern applied to the terminal arrangement unit 43e, is applied to other terminal arrangement units, time constants of wires between all of the DQ terminals and the input/output circuits of the semiconductor device can be made equal to each other.

Figure 10:
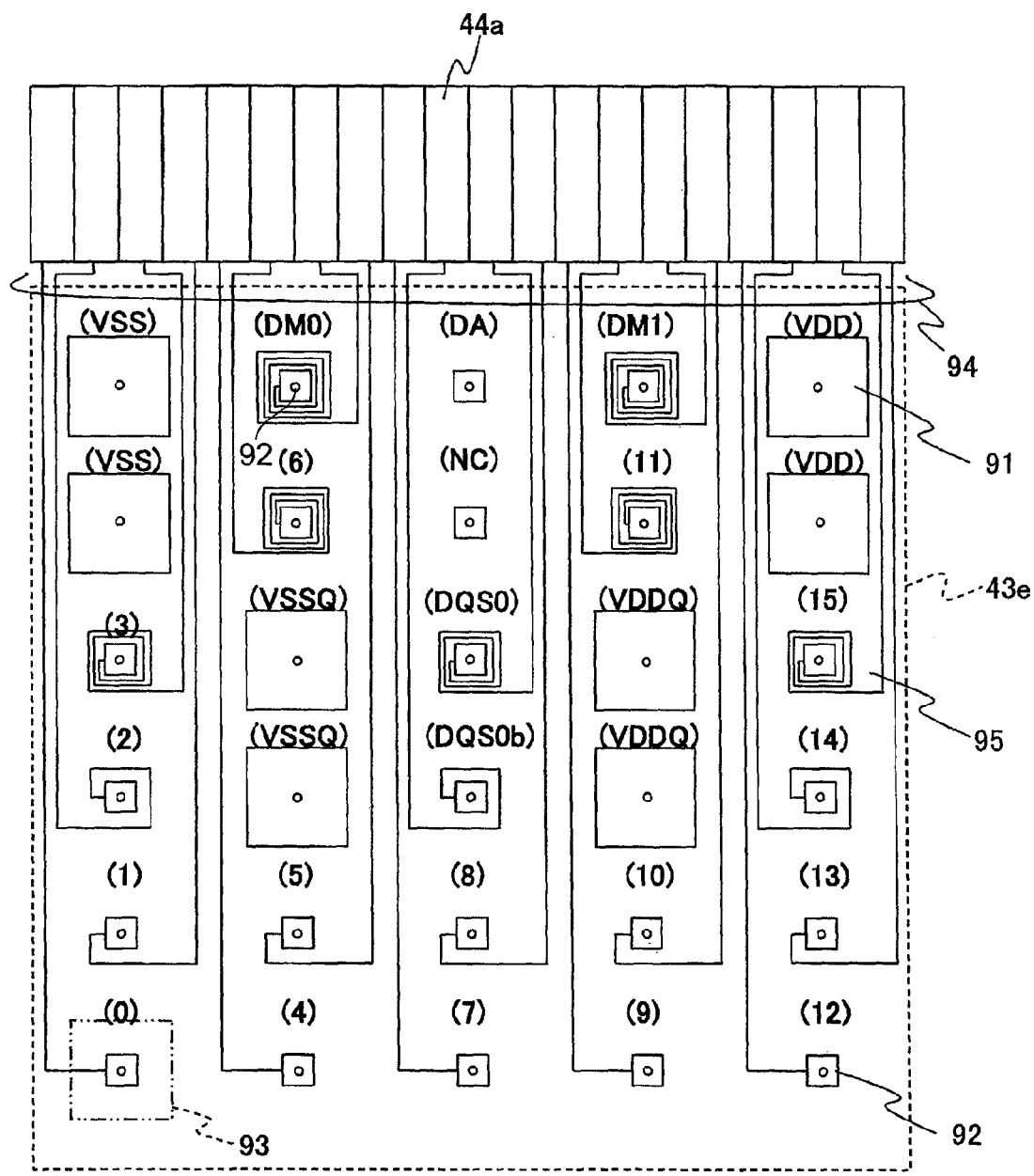
FIG. 10 is a diagram explanatory of a variation of the semiconductor device according to the first embodiment of the present invention.

In the first embodiment, the surplus portions of the wires 94 are bent in a meandering manner. However, as shown in FIG. 10, the surplus portions of the wires 94 may be formed or bent into a swirl around each of the DQ terminals 92. Alternatively, a swirl and a meander may be combined with each other. In any case, the adjustment portions of the wires can be disposed within the margin areas 93. Therefore, time constants of all of the DQ terminals can be made equal to each other without an increase of the chip size.

Figure 11:
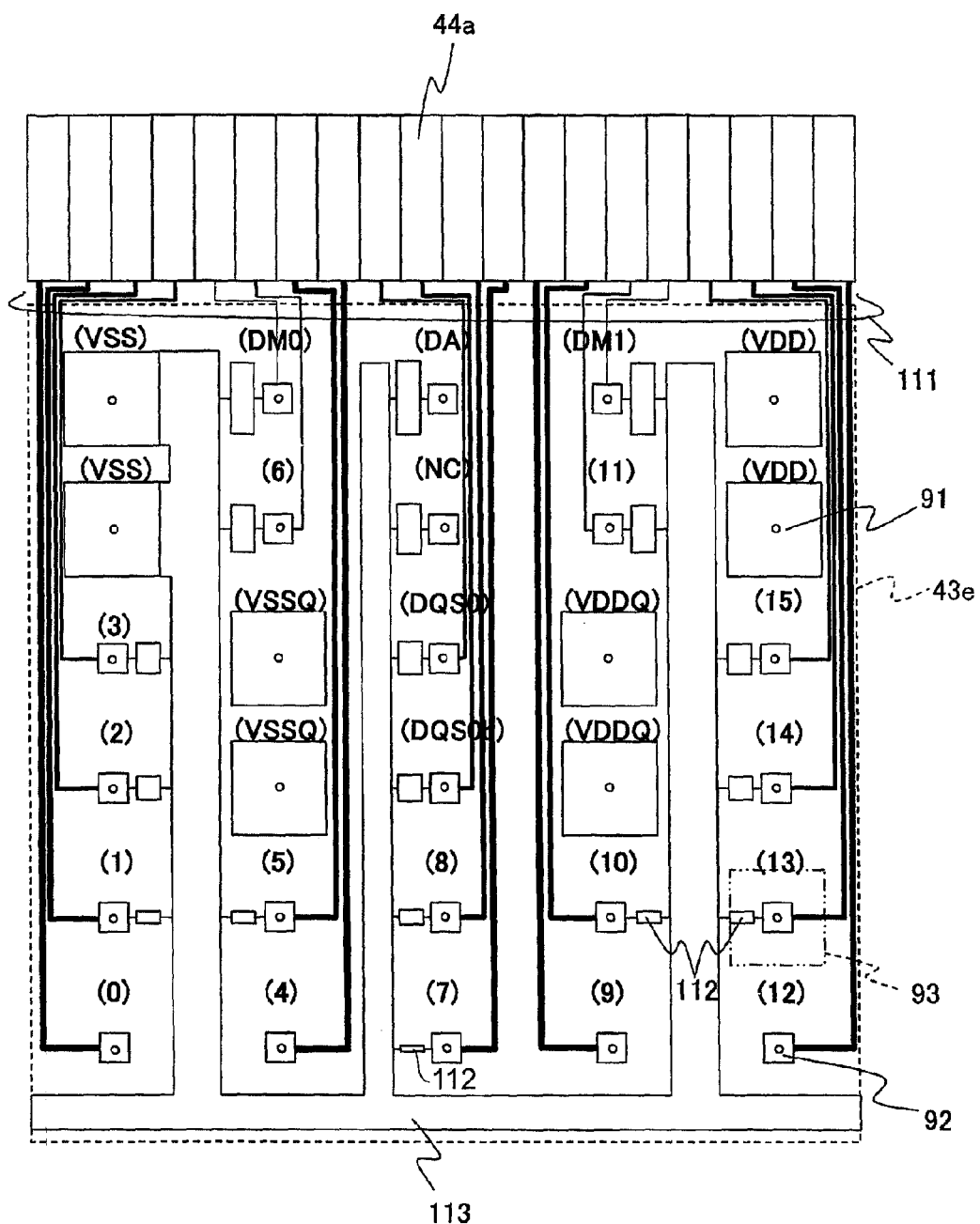
FIG. 11 is a diagram explanatory of a semiconductor device according to a second embodiment of the present invention.
Figure 12:
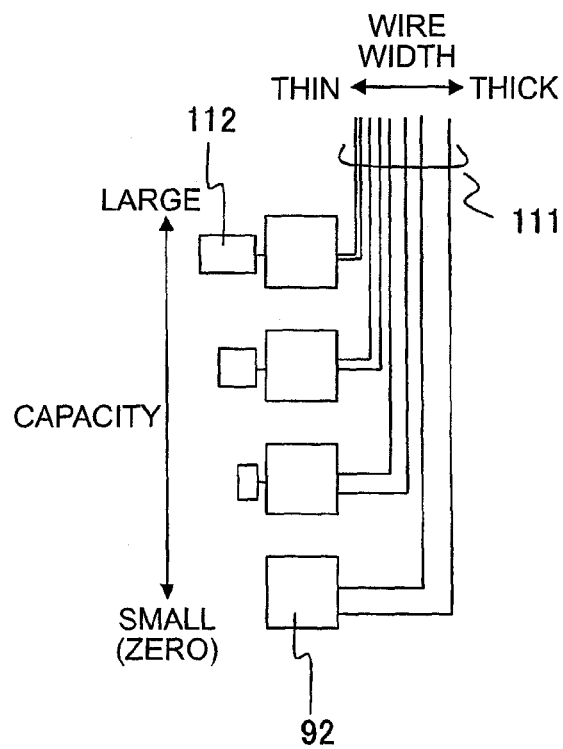
FIG. 12 is a diagram explanatory of the relationship between the wire width and the capacity in the semiconductor device of FIG. 11.

Next, a semiconductor device according to a second embodiment of the present invention will be described with reference to FIGS. 11 to 13. There will be described only differences between the semiconductor device according to the second embodiment and the semiconductor device according to the first embodiment.

In the second embodiment, the width of wires 111 connecting between the DQ terminals 92 and the corresponding input/output circuits 44a, is adjusted such that the wires 111 have the same electric resistance. The width of wires 111 connected to the DQ terminals 92 located nearest the input/output circuits 44a, is used as a reference for adjustment. The wires 111 connected to the DQ terminals 92 located nearest the input/output circuits 44a, are formed so as to have a predetermined width and a length as short as possible. If the DQ terminal 92 is located farther away from the input/output circuits 44a, the width of a wire connected to that DQ terminal 92 is increased so as to reduce an electric resistance per unit length. Portions of the wires that have been widened as compared to the width of the reference wires serve as first adjustment portions for adjusting a time constant of an interface.

In order to cancel a difference of parasitic capacitances that is caused by differences of the width of the wires 111, an adjustment capacitor (capacitance element) 112 is connected to each of the DQ terminals 92. The adjustment capacitors 112 can be formed by using the same wiring layer as the wiring layer used for formation of the wires 111. The adjustment capacitors 112 are disposed within the margin areas 93. The adjustment capacitors 112 serve as second adjustment portions for adjusting a time constant of an interface.

The parasitic capacitance of the wires 111 becomes the largest on the widest wire. Therefore, the capacity (capacitance) of each of the adjustment capacitors 112 is set based upon the width of the wire 111. Specifically, as a DQ terminal 92 is located closer to the input/output circuits 44a, an adjustment capacitor 112 connected to that DQ terminal 92 is designed so as to have a larger capacity.

Influences from the power supply terminals 91 and the like differ between the central column and other columns. Therefore, the DQ terminals 92 in the central column are connected to adjustment capacitors 112 having a capacity that is different from the capacity of the adjustment capacitors 112 connected to the DQ terminals in other columns. An adjustment capacitor 112 is also connected to the DQ terminal 92 (7) that is located farthest away from the input/output circuits 44a, in the central column.

Each of the adjustment capacitors 112 has a terminal connected to counter electrode wires 113 connected to the VSS terminals. The counter electrode wires 113 are formed by using the same wiring layer. In order to facilitate arrangement of the counter electrode wires 113, the wires 111 connected to the DQ terminals 92 in each of the columns are drawn either rightward or leftward, and adjustment capacitors 112 are connected to the other side of the DQ terminals 92. FIG. 12 briefly illustrates the above arrangement.

Figure 13:
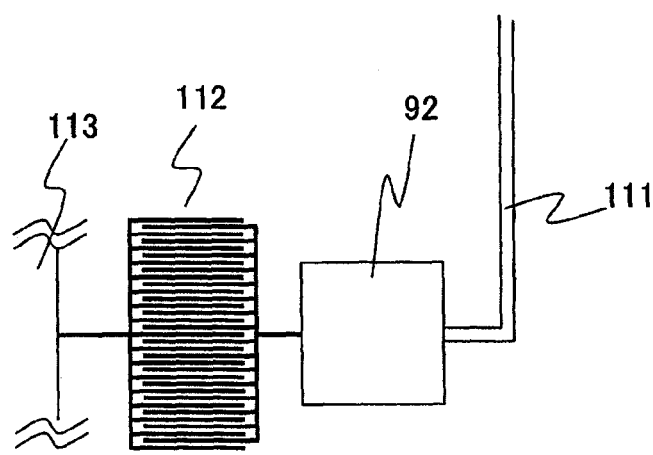
FIG. 13 is a diagram explanatory of a configuration of an adjustment capacitor in the semiconductor device of FIG. 11.

When the adjustment capacitors 112 are formed into a comb-like shape as shown in FIG. 13, a large capacity can be achieved within a limited space. The shape of the adjustment capacitors 112 is not limited to the illustrated one of FIG. 13. The adjustment capacitors 112 may have any shape.

In the second embodiment, a combination of the first adjustment portions and the second adjustment portions can make time constants of a plurality of interfaces equal to each other. Furthermore, both of the first adjustment portions and the second adjustment portions are formed by using the wiring layer used for formation of the DQ terminals 92. Therefore, influence by variations of ambient temperature can be equalized for all of the DQ terminals 92.

Figure 14:
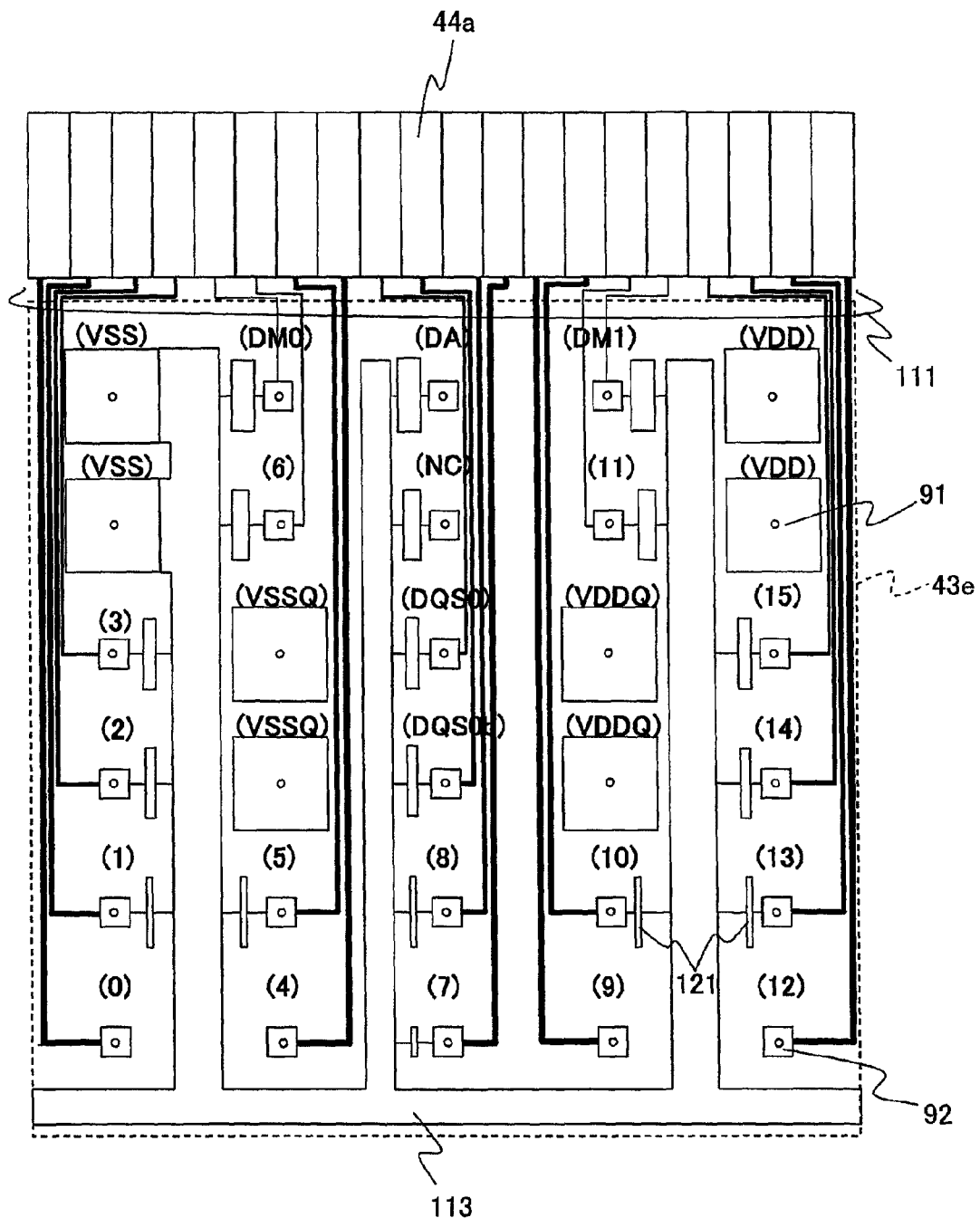
FIG. 14 is a diagram explanatory of a semiconductor device according to a third embodiment of the present invention.

Next, a semiconductor device according to a third embodiment of the present invention will be described with reference to FIGS. 14 to 16. The semiconductor device according to the third embodiment basically has the same configuration as the semiconductor device of the second embodiment. The semiconductor device of the third embodiment has adjustment capacitors 121 instead of the adjustment capacitors 112 (FIG. 11).

The adjustment capacitors 121 are formed by using different wiring layers. For example, the different wiring layers refer to the first Al layer (the same layer as the connection pad 64) and the second layer (the same layer as the connection pad 65) in the structure as shown in FIG. 6. Use of different wiring layers allows the adjustment capacitors 121 to have a parallel-plate structure. Among a plurality of wiring layers, any wiring layers can be used. If adjacent wiring layers are used, a large capacitance can be obtained so that an occupancy area can be reduced.

The wires 111 may be formed by using one of the two wiring layers used for formation of the adjustment capacitors 121. Alternatively, the wires 111 may be formed by using a wiring layer that is different from the two wiring layers used for formation of the adjustment capacitors 121.

The counter electrode wires 113 are formed by using the other wiring layer of the two wiring layers used for formation of the adjustment capacitors 121. For example, if the wires 111 are formed by using the first Al layer, then the counter electrode wires 113 are formed by using the second Al layer.

Figure 15:
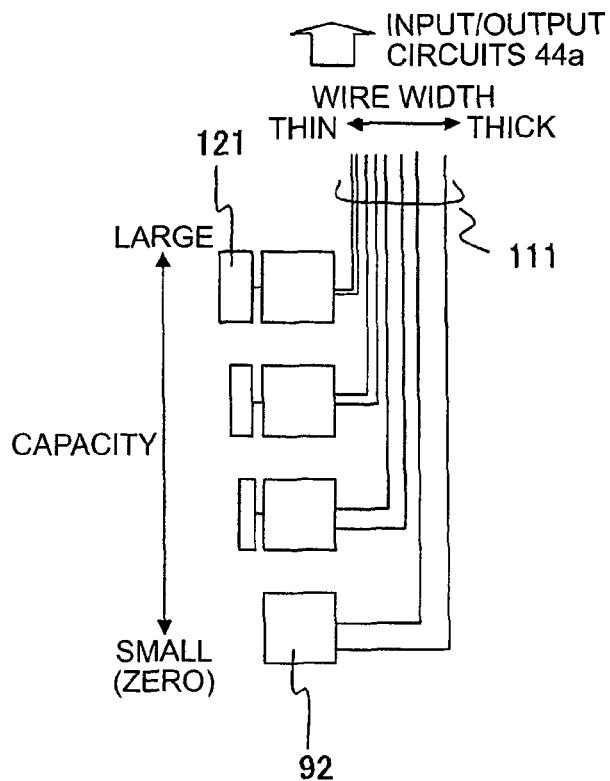
FIG. 15 is a diagram explanatory of the relationship between the wire width and the capacity in the semiconductor device of FIG. 14.
Figure 16:
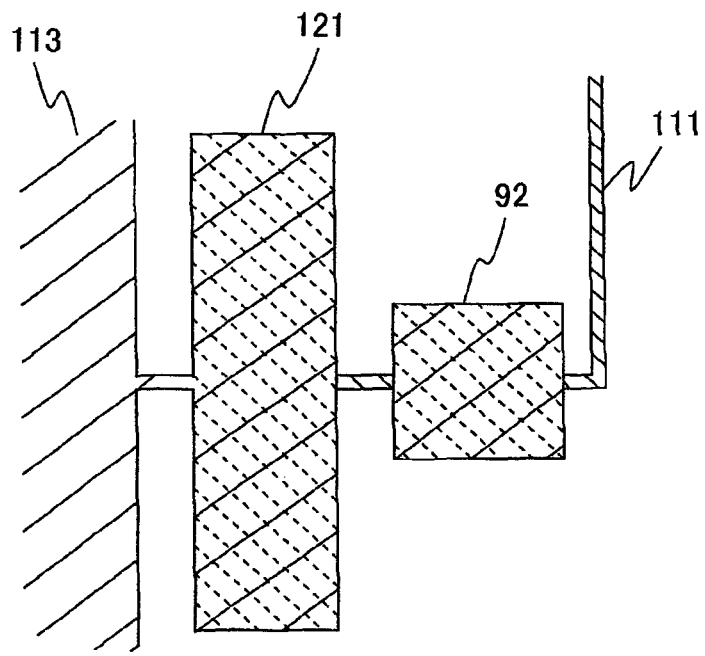
FIG. 16 is a diagram explanatory of a configuration of an adjustment capacitor in the semiconductor device of FIG. 14.

FIG. 15 shows the relationship between the width of the wires 111 and the capacity of the adjustment capacitors 121. Furthermore, FIG. 16 shows a layer structure of the adjustment capacitors 121. In FIG. 16, the areas hatched by slant lines extending downward toward the right represent the first Al layer (on a rear side of the sheet), and the areas hatched by slant lines extending upward toward the right represent the second Al layer (on a front side of the sheet). In a portion where the first Al layer and the second Al layer overlap one another, a lower layer is hatched by dashed slant lines.

In the third embodiment, time constants of a plurality of interfaces can be made substantially equal to each other as with the second embodiment.

Figure 17:
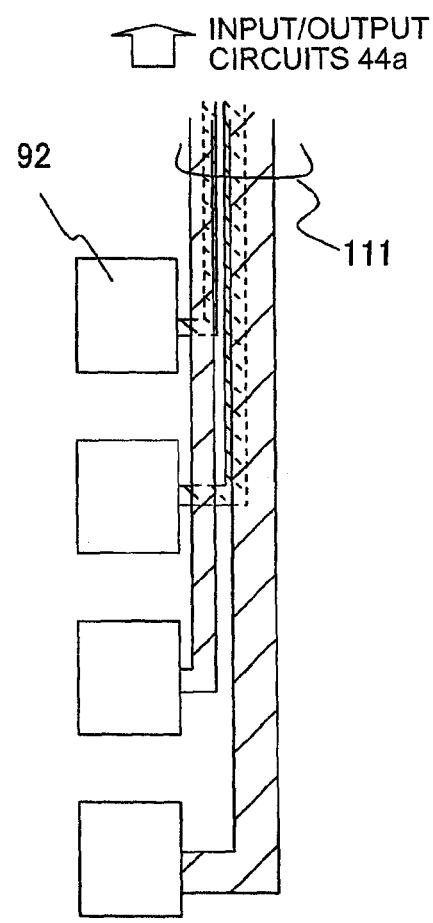
FIG. 17 is a diagram explanatory of a variation of the semiconductor device according to the third embodiment of the present invention.

In the third embodiment, all of the wires 111 are formed by using the same wiring layer. Nevertheless, those wires 111 may be formed by using a plurality of wiring layers. For example, if two different wiring layers have different electric resistivities, then a first wiring layer having a lower first resistivity may be used for wires of DQ terminals 92 located far away from the input/output circuits 44a, whereas a second wiring layer having a higher second resistivity may be used for wires of DQ terminals 92 located near the input/output circuits 44a. For example, if the second Al layer has an electric resistivity lower than that of the first Al layer, as shown in FIG. 17, wires 111 connected to DQ terminals 92 located near the input/output circuits 44a, may be formed by using the first Al layer, whereas wires 111 connected to DQ terminals 92 located far away from the input/output circuits 44a may be formed by using the second Al layer. In this case, the width of wires 111 connected to DQ terminals 92 located far away from the input/output circuits 44a, is prevented from increasing so that an occupancy area required for wires can be reduced.

Figure 19:
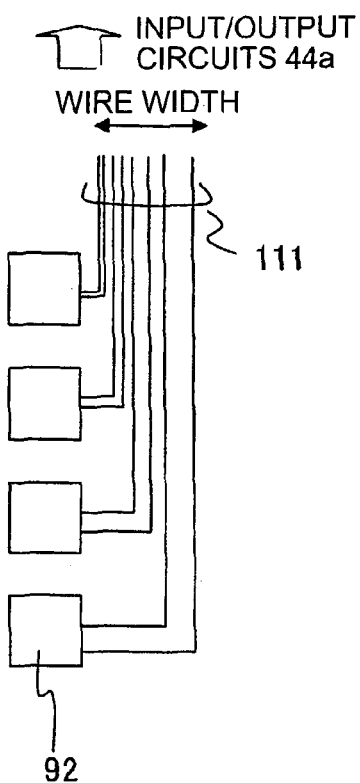
FIG. 19 is a diagram explanatory of the wire width in the semiconductor device of FIG. 18.
Figure 20:
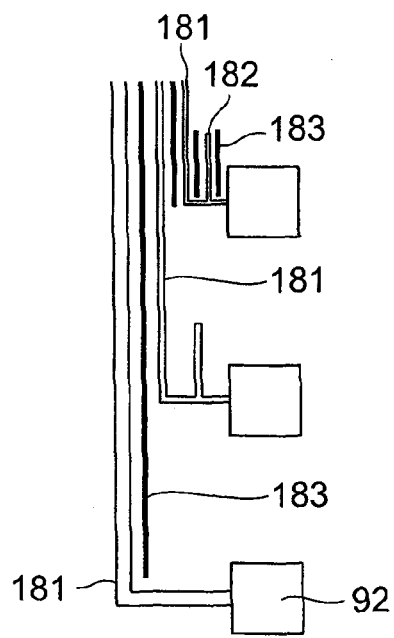
FIG. 20 is a diagram explanatory of an arrangement of shields in the semiconductor device of FIG. 18.

Next, a semiconductor device according to a fourth embodiment of the present invention will be described below with reference to FIGS. 18 to 20.

Figure 18:
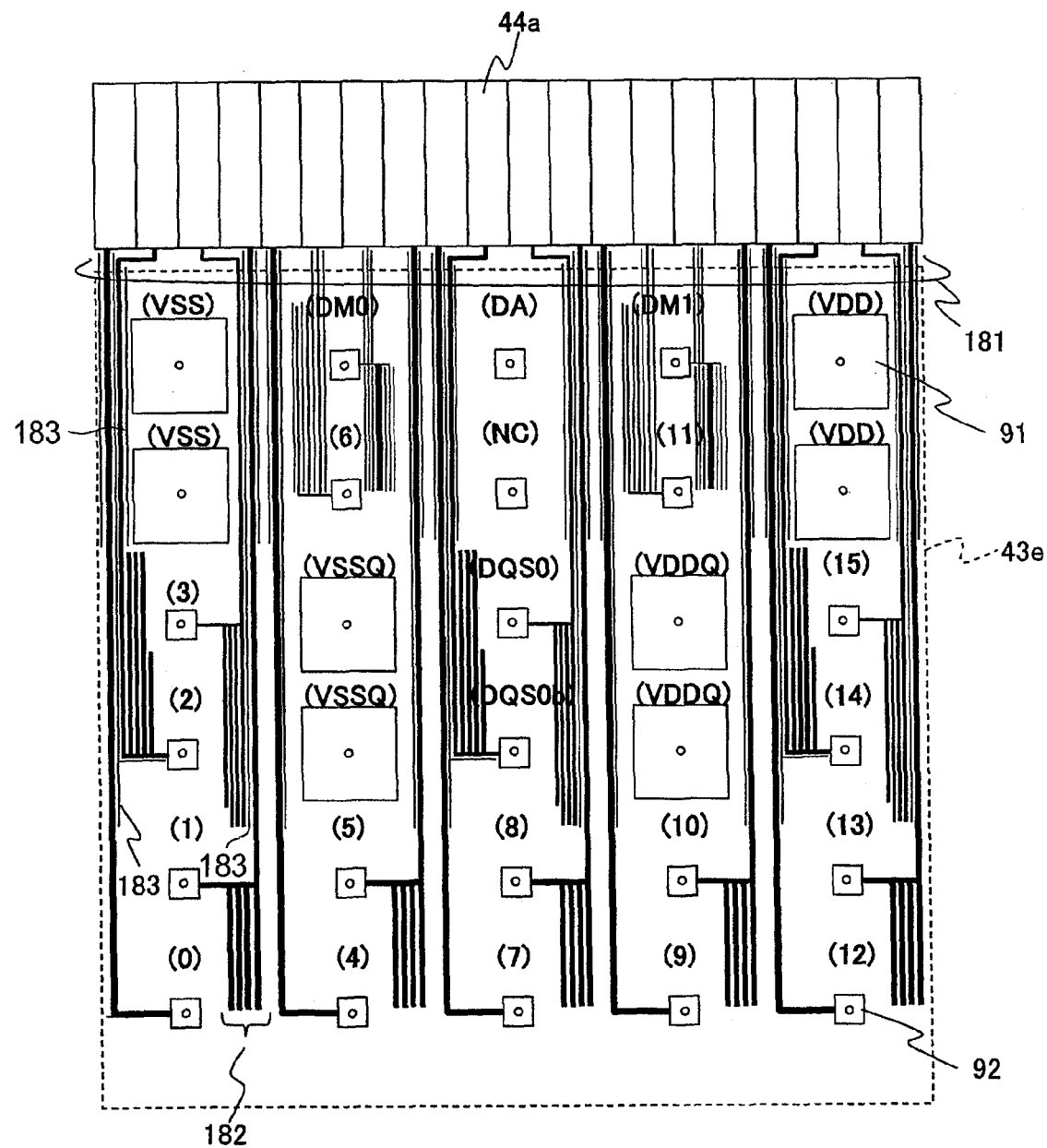
FIG. 18 is a diagram explanatory of a semiconductor device according to a fourth embodiment of the present invention.

As shown in FIG. 18, the DQ terminals 92 are connected to the corresponding input/output circuits 44a, by wires 181. As with the wires 111 of the second embodiment (FIG. 11), the wires 181 are adjusted in width depending upon their length so that electric resistances of all of the wires 181 are made equal to each other. FIG. 19 shows this configuration.

In the second embodiment, the adjustment capacitors 112 (FIG. 12) are provided in order to cancel a difference of parasitic capacitances that is caused by a difference of the width of the wires 111. In the present embodiment, however, a redundant portion 182 (FIG. 20) is provided on each of wires instead of the adjustment capacitors 112. The redundant portion 182 includes one or more wires in this example. When the redundant portion 182 includes a plurality of wires, those wires are formed so as to extend in parallel to each other, for example. In any case, the redundant portion 182 is formed such that the total areas of respective wires (including the redundant portion 182) are equal to each other. Specifically, in the fourth embodiment, widened parts of the wires 181 and the redundant portions 182 serve as adjustment portions for adjusting a time constant of an interface.

Furthermore, in the fourth embodiment, shields 183 are provided for preventing or suppressing capacitive coupling between wires or the like. The shields 183 are formed by using a wiring layer used for formation of the wires 181. As shown in FIG. 20, each of the shields 183 is disposed between two wires 181 arranged in parallel and spaced from each other. Each of the shields 183 extends along those two wires 181. Additionally, a shield 183 is provided as needed between a plurality of wires of the redundant portion. The shields 183 are formed such that the total lengths of the shields adjacent to the respective wires 181 are equal to each other. Furthermore, the shields 183 are connected to either one of the power supply terminals 91, e.g., a VSS terminal.

In the fourth embodiment, time constants of a plurality of interfaces can be made substantially equal to each other. Furthermore, provision of the shields prevents capacitive coupling between wires.

Thus, the present invention has been described along with some embodiments. The present invention is not limited to the illustrated embodiments. Various modifications and changes may be made without departing from the spirit of the present invention. For example, the shields may be used in the semiconductor device according to the first or third embodiment.

The technical concept of the present invention is applicable to semiconductor devices having various functional chips. Furthermore, the connection of wires and the structure of TSVs as disclosed in the drawings are not limited to the circuit configurations illustrated in the embodiments.

The technical concept of a semiconductor device according to the present invention is applicable to various semiconductor devices. For example, the present invention is applicable to general semiconductor devices such as a central processing unit (CPU), a micro control unit (MCU), a digital signal processor (DSP), an application specific integrated circuit (ASIC), an application specific standard product (ASSP), and a memory.

Furthermore, a variety of components being disclosed may be combined or selected in various manners within the scope of the appended claims of the present invention. Specifically, the present invention includes a variety of modifications and changes that would be apparent to those skilled in the art from the entire disclosure and technical concept including the appended claims.

What is claimed is:

1. A semiconductor device comprising:
   a semiconductor substrate;
   a plurality of through silicon vias formed through the semiconductor substrate and spaced at first predetermined intervals in a first direction;
   a plurality of power supply connection pads each having a first size, and the power supply connection pads being connected to first selected ones of the through silicon vias;
   a plurality of input/output connection pads each having a second size, smaller than the first size, and the input/output connection pads being connected to second selected ones of the through silicon vias other than the first selected ones of the through silicon vias;
   a plurality of input/output circuits; and
   a plurality of wires connecting the input/output circuits to respective ones of the input/output connection pads, and wherein the wires include adjustment portions to provide distance compensation between the input/output circuits and respective input/output connection pads.

2. The semiconductor device as claimed in claim 1 wherein the power supply connection pads comprise VDD and VSS power supply connection pads.

3. The semiconductor device as claimed in claim 1 wherein the power supply connection pads comprise VDDQ and VSSQ power supply connection pads.

4. The semiconductor device as claimed in claim 1 wherein the power supply connection pads comprise VDD, VSS, VDDQ and VSSQ power supply connection pads.

5. The semiconductor device as claimed in claim 1 wherein the input/output connection pads comprise address/command connection pads.

6. The semiconductor device as claimed in claim 1 wherein the input/output connection pads comprise DQ connection pads.

7. The semiconductor device as claimed in claim 1 wherein the semiconductor device is a DRAM chip.

8. The semiconductor device as claimed in claim 1 wherein the semiconductor device is a controller chip.

9. The semiconductor device as claimed in claim 1 wherein the semiconductor device is a DRAM.

10. The semiconductor device as claimed in claim 1 wherein the through silicon vias are spaced at second predetermined intervals in a second direction orthogonal to the first direction.

11. The semiconductor device as claimed in claim 1 wherein the second predetermined interval is greater than the first predetermined interval.

12. The semiconductor device as claimed in claim 11 wherein the wires are located within the space defined by the second predetermined interval.

13. The semiconductor device as claimed in claim 1 wherein the adjustment portions are each located in an area defined by the difference between the first size and the second size.

14. The semiconductor device as claimed in claim 1 wherein the wires each have equal length and width, and the adjustment portions each comprise surplus portions of wire not required to span the distance between each input/output circuit and respective input/output connection pad.

15. The semiconductor device as claimed in claim 14 wherein the surplus portion of wire is bent in a meandering manner.

16. The semiconductor device as claimed in claim 14 wherein the surplus portion of wire is formed into a swirl around a respective input/output connection pad.

17. The semiconductor device as claimed in claim 1 wherein the adjustment portions each comprise a capacitor.

18. The semiconductor device as claimed in claim 17 wherein the capacitor comprises a comb-shaped capacitor.

19. The semiconductor device as claimed in claim 17 wherein the adjustment portions each comprise a parallel plate structure.

20. The semiconductor device as claimed in claim 1 wherein the wires each have substantially the same resistance.

21. The semiconductor device as claimed in claim 1 wherein the wires each have substantially the same capacitance.

22. The semiconductor device as claimed in claim 1 wherein the wires each have substantially the same time constant.

* * * * *